(12) United States Patent
Xi

(10) Patent No.: US 11,521,528 B2
(45) Date of Patent: Dec. 6, 2022

(54) GOA CIRCUIT AND DISPLAY PANEL INCLUDING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Suping Xi, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 542 days.

(21) Appl. No.: 16/625,024

(22) PCT Filed: Dec. 11, 2019

(86) PCT No.: PCT/CN2019/124482
§ 371 (c)(1),
(2) Date: Dec. 20, 2019

(87) PCT Pub. No.: WO2021/103145
PCT Pub. Date: Jun. 3, 2021

(65) Prior Publication Data
US 2021/0366338 A1 Nov. 25, 2021

(30) Foreign Application Priority Data
Nov. 25, 2019 (CN) .......................... 201911164593.4

(51) Int. Cl.
*G09G 3/20* (2006.01)
*H01L 27/02* (2006.01)

(52) U.S. Cl.
CPC ........... *G09G 3/20* (2013.01); *H01L 27/0248* (2013.01); *G09G 2300/0408* (2013.01); *G09G 2310/08* (2013.01); *G09G 2330/04* (2013.01)

(58) Field of Classification Search
USPC ...................................................... 345/204
See application file for complete search history.

(56) References Cited

U.S. PATENT DOCUMENTS

| 2015/0115271 A1 | 4/2015 | Yoon et al. |
| 2015/0357322 A1 | 12/2015 | Russ et al. |
| 2017/0160607 A1 | 6/2017 | Zhao et al. |

FOREIGN PATENT DOCUMENTS

| CN | 102929051 A | 2/2013 |
| CN | 104882451 A | 9/2015 |
| CN | 104965369 A | 10/2015 |
| CN | 105070239 A | 11/2015 |

(Continued)

*Primary Examiner* — Ifedayo B Iluyomade
(74) *Attorney, Agent, or Firm* — Dickinson Wright PLLC

(57) ABSTRACT

A gate driver on array (GOA) circuit and a display panel including the same are provided. The GOA circuit includes: a GOA drive signal line including a voltage common (VCOM) signal line, a start vertical (STV) signal line, a reference voltage (VSS) signal line, and a low-frequency clock (LC) signal line; and a GOA protection circuit, wherein an end of the GOA protection circuit is connected to the VCOM signal line, and another end thereof is electrically connected to the STV signal line, the VSS signal line, and the LC signal line.

20 Claims, 2 Drawing Sheets

(56) References Cited

FOREIGN PATENT DOCUMENTS

| CN | 106526929 | A | 3/2017 | |
| CN | 107785350 | * | 3/2018 | ............... G09G 3/20 |
| CN | 107785350 | A | 3/2018 | |
| CN | 108732840 | A | 11/2018 | |
| CN | 109346463 | A | 2/2019 | |
| CN | 109375442 | A | 2/2019 | |
| KR | 2007001662 | * | 2/2007 | |

* cited by examiner

GOA CIRCUIT AND DISPLAY PANEL INCLUDING SAME

FIELD OF INVENTION

The present disclosure relates to the field of display panel manufacturing technologies, and more particularly to a gate driver on array (GOA) circuit and a display panel including the same.

BACKGROUND OF INVENTION

Gate driver on array (GOA) designs usually use an array process to make a gate line scan driving signal circuit on an array substrate to realize a driving method of line-by-line scan of a gate. GOA will inevitably use a pad to complete various test functions. A tip of an instrument used in the test will be stuck in the pad. At this time, electrostatic discharge is easy to occur, which will damage a panel. This makes the pad unable to perform corresponding functions and affects stability of the panel.

SUMMARY OF INVENTION

An object of the present application is to provide a gate driver on array (GOA) protection circuit to solve issues of electrostatic discharge of needles during testing in the prior art.

In order to solve the above issues, an embodiment of the present application provides a GOA circuit, comprising: a GOA drive signal line comprising a voltage common (VCOM) signal line, a start vertical (STV) signal line, a reference voltage (VSS) signal line, and a low-frequency clock (LC) signal line; and a GOA protection circuit, wherein an end of the GOA protection circuit is connected to the VCOM signal line, and another end thereof is electrically connected to the STV signal line, the VSS signal line, and the LC signal line. In this design, static electricity is released through the GOA protection circuit, which can effectively prevent damage to a GOA drive signal line during electrostatic discharge, and will not have a substantial impact on function of a pad when testing a panel.

In the GOA circuit according to an embodiment of the present application, the GOA protection circuit comprises: a transparent substrate; a first metal layer disposed on a side surface of the transparent substrate; an insulating layer disposed on a side surface of the first metal layer away from the transparent substrate and the side surface of the transparent substrate; an active layer disposed on a side surface of the insulating layer away from the first metal layer; a doped layer disposed on a side surface of the active layer away from the insulating layer and having a first via hole; a second metal layer disposed on a side surface of the doped layer away from the active layer and having a second via hole; a passivation layer disposed on a side surface of the second metal layer away from the doped layer and the side surface of the active layer away from the insulating layer, covering the doped layer and the second metal layer; and an antistatic layer disposed on a side surface of the passivation layer away from the second metal layer and having at least one deep hole and at least one shallow hole.

In the GOA circuit according to an embodiment of the present application, the antistatic layer is electrically connected to the first metal layer through the deep hole.

In the GOA circuit according to an embodiment of the present application, the antistatic layer is electrically connected to the second metal layer through the shallow hole.

Advantages of this design are that static electricity is discharged through the antistatic layer, which effectively avoids damage to a GOA drive signal line during electrostatic discharge, and does not have a substantial impact on function of a pad when testing a panel.

In the GOA circuit according to an embodiment of the present application, the antistatic layer is an indium tin oxide (ITO) layer.

In the GOA circuit according to an embodiment of the present application, the GOA protection circuit comprises a first diode, a second diode, and a third diode, and the first diode, the second diode, and the third diode are connected in parallel.

In the GOA circuit according to an embodiment of the present application, the diode is an I-type. The I-type design helps to reduce space and not take up extra space.

In the GOA circuit according to an embodiment of the present application, material of the passivation layer may be silicon oxide, and/or silicon oxynitride, and/or silicon nitride, or may be a transparent perfluoroalkoxy (PFA).

In the GOA circuit according to an embodiment of the present application, an end of the antistatic layer is connected to the GOA protection circuit, and another end thereof is overlapped with the STV signal line, the VSS signal line, and the LC signal line.

An embodiment of the present application further provides a display panel using the above GOA circuit, comprising: a GOA drive signal line comprising a voltage common (VCOM) signal line, a start vertical (STV) signal line, a reference voltage (VSS) signal line, and a low-frequency clock (LC) signal line; and a GOA protection circuit, wherein an end of the GOA protection circuit is connected to the VCOM signal line, and another end thereof is electrically connected to the STV signal line, the VSS signal line, and the LC signal line. In this design, static electricity is released through the GOA protection circuit, which can effectively prevent damage to a GOA drive signal line during electrostatic discharge, and will not have a substantial impact on function of a pad when testing a panel.

In the display panel according to an embodiment of the present application, the GOA protection circuit comprises: a transparent substrate; a first metal layer disposed on a side surface of the transparent substrate; an insulating layer disposed on a side surface of the first metal layer away from the transparent substrate and the side surface of the transparent substrate; an active layer disposed on a side surface of the insulating layer away from the first metal layer; a doped layer disposed on a side surface of the active layer away from the insulating layer and having a first via hole; a second metal layer disposed on a side surface of the doped layer away from the active layer and having a second via hole; a passivation layer disposed on a side surface of the second metal layer away from the doped layer and the side surface of the active layer away from the insulating layer, covering the doped layer and the second metal layer; and an antistatic layer disposed on a side surface of the passivation layer away from the second metal layer and having at least one deep hole and at least one shallow hole.

In the display panel according to an embodiment of the present application, the antistatic layer is electrically connected to the first metal layer through the deep hole.

In the display panel according to an embodiment of the present application, the antistatic layer is electrically connected to the second metal layer through the shallow hole.

In the display panel according to an embodiment of the present application, the antistatic layer is an indium tin oxide (ITO) layer.

In the display panel according to an embodiment of the present application, the GOA protection circuit comprises a first diode, a second diode, and a third diode, and the first diode, the second diode, and the third diode are connected in parallel.

In the display panel according to an embodiment of the present application, the diode is an I-type. The I-type design helps to reduce space and not take up extra space.

In the display panel according to an embodiment of the present application, material of the passivation layer may be silicon oxide, and/or silicon oxynitride, and/or silicon nitride, or may be a transparent perfluoroalkoxy (PFA).

In the display panel according to an embodiment of the present application, an end of the antistatic layer is connected to the GOA protection circuit, and another end thereof is overlapped with the STV signal line, the VSS signal line, and the LC signal line.

Beneficial effects of the present application are that, compared with the prior art, a GOA circuit and a display panel including the same provided in embodiments of the present application include an I-type diode GOA protection circuit in the GOA circuit. This design helps to reduce space without taking up extra space. The static electricity is discharged through the GOA protection circuit, which effectively avoids damage to the GOA circuit during electrostatic discharge. When testing the panel, it will not have a substantial impact on function of the pad.

DETAILED DESCRIPTION OF PREFERRED EMBODIMENTS

Figure 1:
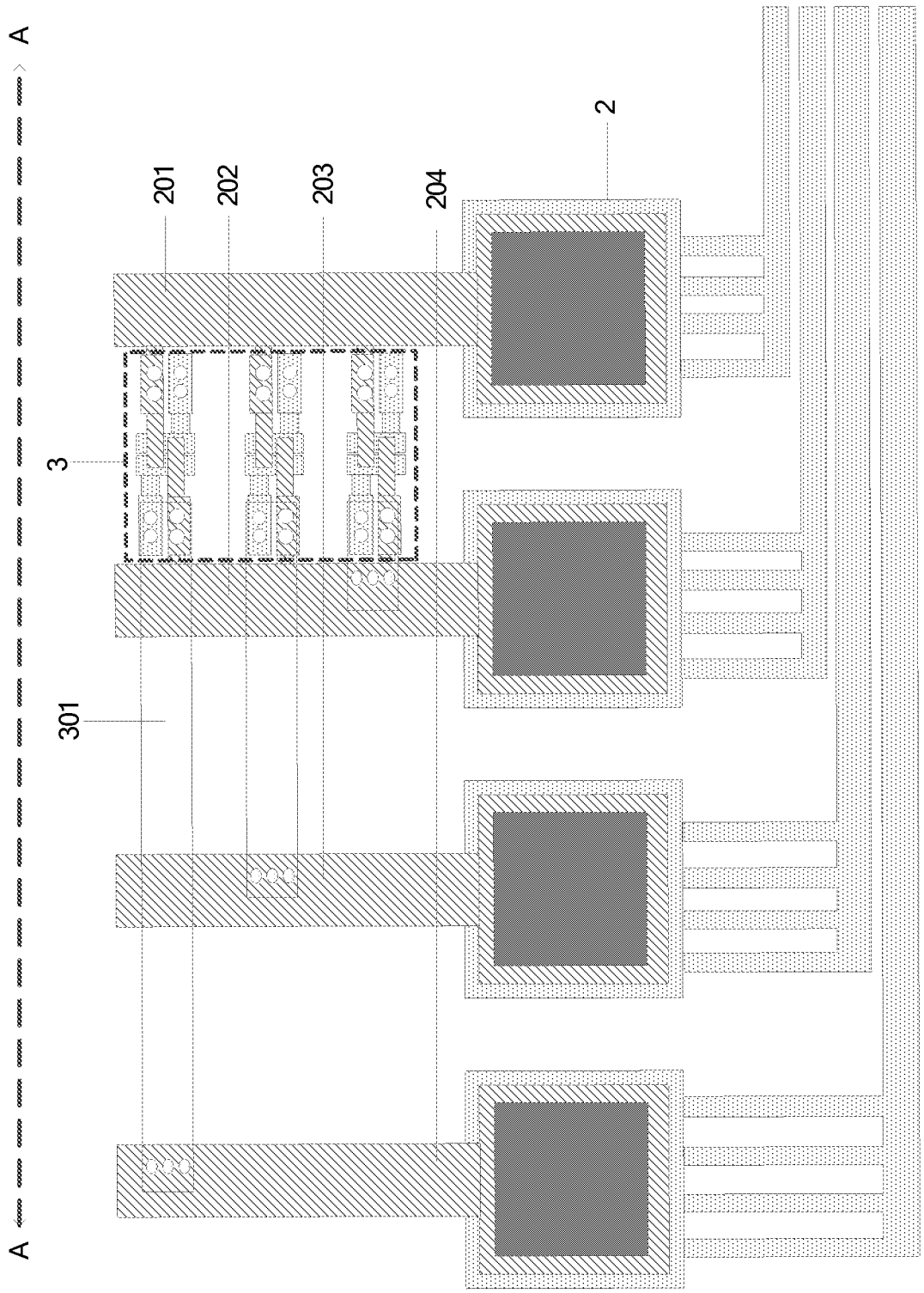
FIG. 1 is a top view of a GOA circuit structure in an embodiment of the present application.

The structure and function of the preferred embodiment of the present application will be described in detail below with reference to the accompanying drawings of the description. Obviously, the embodiment described below is only one of many aspects of the present application, and belongs to a part of the detailed technology of the present application.

The terms used in the specification of the present application are only used to describe specific embodiments, and are not intended to show the concepts of the present application. Unless the context clearly indicates a different meaning, expressions used in the singular encompass expressions in the plural. In this specification, it should be understood that terms such as "including", "having", and "containing" are intended to indicate the possibility of features, numbers, steps, actions, or combinations thereof disclosed in this specification. It is not intended to exclude the possibility that one or more other features, numbers, steps, actions, or a combination thereof may be present or may be added. The same reference numerals in the drawings refer to the same parts.

Hereinafter, embodiments of the present application will be described in detail with reference to the accompanying drawings.

Referring to FIG. 1, an embodiment of the present application provides a GOA circuit 1, comprising: a GOA drive signal line 2 comprising a voltage common (VCOM) signal line 201, a start vertical (STV) signal line 202, a reference voltage (VSS) signal line 203, and a low-frequency clock (LC) signal line 204; and a GOA protection circuit 3, wherein an end of the GOA protection circuit 3 is connected to the VCOM signal line 201, and another end thereof is electrically connected to the STV signal line 202, the VSS signal line 203, and the LC signal line 204. In this design, static electricity is released through an antistatic layer, which can effectively prevent damage to a GOA drive signal line during electrostatic discharge, and will not have a substantial impact on function of a pad when testing a panel.

Figure 2:
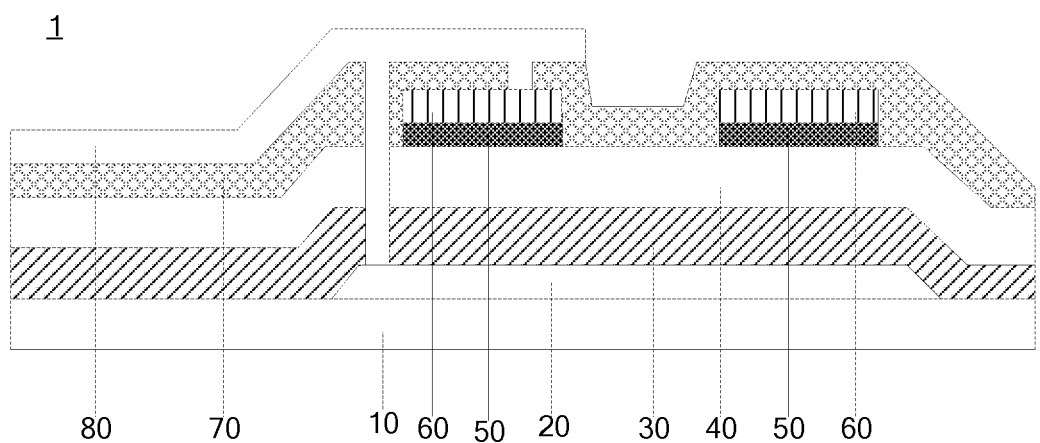
FIG. 2 is a cross-sectional view of the GOA protection circuit along A-A direction of FIG. 1.

Referring to FIG. 1 and FIG. 2, in an embodiment of the present application, the GOA protection circuit 3 comprises: a transparent substrate 10; a first metal layer 20 disposed on a side surface of the transparent substrate 10; an insulating layer 30 disposed on a side surface of the first metal layer 20 away from the transparent substrate 10 and the side surface of the transparent substrate 10 near the first metal layer 20; an active layer 40 disposed on a side surface of the insulating layer 30 away from the first metal layer 20; a doped layer 50 disposed on a side surface of the active layer 40 away from the insulating layer 30 and having a first via hole; a second metal layer 60 disposed on a side surface of the doped layer 50 away from the active layer 40 and having a second via hole; a passivation layer 70 disposed on a side surface of the second metal layer 60 away from the doped layer 50 and the side surface of the active layer 40 away from the insulating layer 30, covering the doped layer 50 and the second metal layer 60; and an antistatic layer 80 disposed on a side surface of the passivation layer 70 away from the second metal layer 60 and having at least one deep hole and at least one shallow hole.

In an embodiment of the present application, the antistatic layer 80 is electrically connected to the first metal layer 20 through the deep hole.

In an embodiment of the present application, the antistatic layer 80 is electrically connected to the second metal layer 60 through the shallow hole.

Advantages of this design are that static electricity is discharged through the antistatic layer, which effectively avoids damage to a GOA drive signal line during electrostatic discharge, and does not have a substantial impact on function of a pad when testing a panel.

In an embodiment of the present application, the antistatic layer 80 is an indium tin oxide (ITO) layer. However, in other embodiments of the present application, the antistatic layer 80 may also be made of the same metal as the first metal layer 20 and/or the second metal layer 60.

In an embodiment of the present application, the GOA protection circuit 3 comprises a first diode, a second diode, and a third diode, and the first diode, the second diode, and the third diode are connected in parallel.

In an embodiment of the present application, the diode is an I-type. The I-type design helps to reduce space and not take up extra space.

In an embodiment of the present application, material of the passivation layer may be silicon oxide, and/or silicon oxynitride, and/or silicon nitride, or may be a transparent perfluoroalkoxy (PFA).

In an embodiment of the present application, an end of the antistatic layer 80 is connected to the GOA protection circuit 3, and another end thereof is overlapped with the STV signal line 202, the VSS signal line 203, and the LC signal line 204. In this design, static electricity is released through the GOA protection circuit, which can effectively prevent damage to a GOA drive signal line during electrostatic discharge, and will not have a substantial impact on function of a pad when testing a panel.

An embodiment of the present application further provides a display panel using the above GOA circuit 1, comprising: a GOA drive signal line 2 comprising a voltage common (VCOM) signal line 201, a start vertical (STV) signal line 202, a reference voltage (VSS) signal line 203, and a low-frequency clock (LC) signal line 204; and a GOA protection circuit 3, wherein an end of the GOA protection circuit 3 is connected to the VCOM signal line 201, and another end thereof is electrically connected to the STV signal line 202, the VSS signal line 203, and the LC signal line 204. In this design, static electricity is released through the GOA protection circuit, which can effectively prevent damage to a GOA drive signal line during electrostatic discharge, and will not have a substantial impact on function of a pad when testing a panel.

In an embodiment of the present application, the GOA protection circuit 3 comprises: a transparent substrate 10; a first metal layer 20 disposed on a side surface of the transparent substrate 10; an insulating layer 30 disposed on a side surface of the first metal layer 20 away from the transparent substrate 10 and the side surface of the transparent substrate 10 near the first metal layer 20; an active layer 40 disposed on a side surface of the insulating layer 30 away from the first metal layer 20; a doped layer 50 disposed on a side surface of the active layer 40 away from the insulating layer 30 and having a first via hole; a second metal layer 60 disposed on a side surface of the doped layer 50 away from the active layer 40 and having a second via hole; a passivation layer 70 disposed on a side surface of the second metal layer 60 away from the doped layer 50 and the side surface of the active layer 40 away from the insulating layer 30, covering the doped layer 50 and the second metal layer 60; and an antistatic layer 80 disposed on a side surface of the passivation layer 70 away from the second metal layer 60 and having at least one deep hole and at least one shallow hole.

In an embodiment of the present application, the antistatic layer 80 is electrically connected to the first metal layer 20 through the deep hole.

In an embodiment of the present application, the antistatic layer 80 is electrically connected to the second metal layer 60 through the shallow hole.

Advantages of this design are that static electricity is discharged through the antistatic layer, which effectively avoids damage to a GOA drive signal line during electrostatic discharge, and does not have a substantial impact on function of a pad when testing a panel.

In an embodiment of the present application, the antistatic layer 80 is an indium tin oxide (ITO) layer 301. However, in other embodiments of the present application, the antistatic layer 80 may also be made of the same metal as the first metal layer 20 and/or the second metal layer 60.

In an embodiment of the present application, the GOA protection circuit 3 comprises a first diode, a second diode, and a third diode, and the first diode, the second diode, and the third diode are connected in parallel.

In an embodiment of the present application, the diode is an I-type. The I-type design helps to reduce space and not take up extra space.

In an embodiment of the present application, material of the passivation layer may be silicon oxide, and/or silicon oxynitride, and/or silicon nitride, or may be a transparent perfluoroalkoxy (PFA).

In an embodiment of the present application, an end of the antistatic layer 80 is connected to the GOA protection circuit 3, and another end thereof is overlapped with the STV signal line 202, the VSS signal line 203, and the LC signal line 204. In this design, static electricity is released through the GOA protection circuit, which can effectively prevent damage to a GOA drive signal line during electrostatic discharge, and will not have a substantial impact on function of a pad when testing a panel.

In summary, in embodiments of the present application, I-type diode GOA protection circuit is disposed in the GOA circuit. This design helps to reduce space without taking up extra space. The static electricity is discharged through the GOA protection circuit, which effectively avoids damage to the GOA circuit during electrostatic discharge. When testing the panel, it will not have a substantial impact on function of the pad.

The above are the preferred embodiments provided by the present application, but the protection scope of the present application is not limited by specific embodiments. Those skilled in the art can make structural element replacements and other changes within the scope of the present application. Such changes as replacements should also fall within the protection scope of the present application.

What is claimed is:

1. A gate driver on array (GOA) circuit, comprising:
   a GOA drive signal line comprising a voltage common (VCOM) signal line, a start vertical (STV) signal line, a reference voltage (VSS) signal line, and a low-frequency clock (LC) signal line; and
   a GOA protection circuit, wherein an end of the GOA protection circuit is connected to the VCOM signal line, and another end thereof is electrically connected to the STV signal line, the VSS signal line, and the LC signal line;
   wherein the GOA protection circuit comprises a first diode, a second diode, and a third diode, and the first diode, the second diode, and the third diode are connected in parallel.

2. The GOA circuit according to claim 1, wherein the GOA protection circuit comprises:
   a transparent substrate;
   a first metal layer disposed on a side surface of the transparent substrate;
   an insulating layer disposed on a side surface of the first metal layer away from the transparent substrate and the side surface of the transparent substrate;
   an active layer disposed on a side surface of the insulating layer away from the first metal layer;
   a doped layer disposed on a side surface of the active layer away from the insulating layer and having a first via hole;
   a second metal layer disposed on a side surface of the doped layer away from the active layer and having a second via hole;
   a passivation layer disposed on a side surface of the second metal layer away from the doped layer and the side surface of the active layer away from the insulating layer, covering the doped layer and the second metal layer; and
   an antistatic layer disposed on a side surface of the passivation layer away from the second metal layer and having at least one deep hole and at least one shallow hole.

3. The GOA circuit according to claim 2, wherein the antistatic layer is electrically connected to the first metal layer through the deep hole.

4. The GOA circuit according to claim 2, wherein the antistatic layer is electrically connected to the second metal layer through the shallow hole.

5. The GOA circuit according to claim 2, wherein the antistatic layer is an indium tin oxide (ITO) layer.

6. The GOA circuit according to claim 1, wherein the diode is an I-type.

7. The GOA circuit according to claim 2, wherein material of the passivation layer comprises a transparent perfluoroalkoxy (PFA).

8. The GOA circuit according to claim 2, wherein an end of the antistatic layer is connected to the GOA protection circuit, and another end thereof is overlapped with the STV signal line, the VSS signal line, and the LC signal line.

9. A display panel using the GOA circuit according to claim 1, comprising:
   a GOA drive signal line comprising a voltage common (VCOM) signal line, a start vertical (STV) signal line, a reference voltage (VSS) signal line, and a low-frequency clock (LC) signal line; and
   a GOA protection circuit, wherein an end of the GOA protection circuit is connected to the VCOM signal line, and another end thereof is electrically connected to the STV signal line, the VSS signal line, and the LC signal line.

10. The display panel according to claim 9, wherein the GOA protection circuit comprises:
    a transparent substrate;
    a first metal layer disposed on a side surface of the transparent substrate;
    an insulating layer disposed on a side surface of the first metal layer away from the transparent substrate and the side surface of the transparent substrate;
    an active layer disposed on a side surface of the insulating layer away from the first metal layer;
    a doped layer disposed on a side surface of the active layer away from the insulating layer and having a first via hole;
    a second metal layer disposed on a side surface of the doped layer away from the active layer and having a second via hole;
    a passivation layer disposed on a side surface of the second metal layer away from the doped layer and the side surface of the active layer away from the insulating layer, covering the doped layer and the second metal layer; and
    an antistatic layer disposed on a side surface of the passivation layer away from the second metal layer and having at least one deep hole and at least one shallow hole.

11. The display panel according to claim 10, wherein the antistatic layer is electrically connected to the first metal layer through the deep hole.

12. The display panel according to claim 10, wherein the antistatic layer is electrically connected to the second metal layer through the shallow hole.

13. The display panel according to claim 10, wherein the antistatic layer is an indium tin oxide (ITO) layer.

14. The display panel according to claim 10, wherein material of the passivation layer comprises a transparent perfluoroalkoxy (PFA).

15. The display panel according to claim 10, wherein an end of the antistatic layer is connected to the GOA protection circuit, and another end thereof is overlapped with the STV signal line, the VSS signal line, and the LC signal line.

16. A gate driver on array (GOA) circuit, comprising:
    a GOA drive signal line comprising a voltage common (VCOM) signal line, a start vertical (STV) signal line, a reference voltage (VSS) signal line, and a low-frequency clock (LC) signal line; and
    a GOA protection circuit, wherein an end of the GOA protection circuit is connected to the VCOM signal line, and another end thereof is electrically connected to the STV signal line, the VSS signal line, and the LC signal line;
    wherein the GOA protection circuit comprises:
    a transparent substrate;
    a first metal layer disposed on a side surface of the transparent substrate;
    an insulating layer disposed on a side surface of the first metal layer away from the transparent substrate and the side surface of the transparent substrate;
    an active layer disposed on a side surface of the insulating layer away from the first metal layer;
    a doped layer disposed on a side surface of the active layer away from the insulating layer and having a first via hole;
    a second metal layer disposed on a side surface of the doped layer away from the active layer and having a second via hole;
    a passivation layer disposed on a side surface of the second metal layer away from the doped layer and the side surface of the active layer away from the insulating layer, covering the doped layer and the second metal layer; and
    an antistatic layer disposed on a side surface of the passivation layer away from the second metal layer and having at least one deep hole and at least one shallow hole.

17. The GOA circuit according to claim 16, wherein the antistatic layer is electrically connected to the first metal layer through the deep hole.

18. The GOA circuit according to claim 16, wherein the antistatic layer is electrically connected to the second metal layer through the shallow hole.

19. The GOA circuit according to claim 16, wherein the antistatic layer is an indium tin oxide (ITO) layer.

20. The GOA circuit according to claim 16, wherein material of the passivation layer comprises a transparent perfluoroalkoxy (PFA).

* * * * *